(12) United States Patent
Lee

(10) Patent No.: US 7,635,625 B2
(45) Date of Patent: Dec. 22, 2009

(54) METHOD FOR MANUFACTURING IMAGE SENSOR

(75) Inventor: Joo Hyun Lee, Icheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 64 days.

(21) Appl. No.: 11/831,690

(22) Filed: Jul. 31, 2007

(65) Prior Publication Data

US 2008/0119006 A1 May 22, 2008

(30) Foreign Application Priority Data

Nov. 20, 2006 (KR) .................. 10-2006-0114756

(51) Int. Cl.
*H01L 21/8242* (2006.01)

(52) U.S. Cl. .............. 438/241; 438/475; 438/680; 438/663; 257/E21.17; 257/E21.231; 257/E21.248; 257/E21.319; 257/E21.499

(58) Field of Classification Search ............... 438/241, 438/258, 430, 475, 663, 680, 770, 506, 604
See application file for complete search history.

(56) References Cited

U.S. PATENT DOCUMENTS

| | | | |
|---|---|---|---|
| 6,204,141 B1 * | 3/2001 | Lou ........................ | 438/386 |
| 7,217,968 B2 * | 5/2007 | Adkisson et al. ........... | 257/292 |
| 2006/0118835 A1 * | 6/2006 | Ellis-Monaghan et al. .. | 257/292 |
| 2006/0124976 A1 * | 6/2006 | Adkisson et al. ........... | 257/292 |
| 2007/0184614 A1 * | 8/2007 | Adkisson et al. ........... | 438/259 |
| 2008/0179639 A1 * | 7/2008 | Gambino et al. ............ | 257/291 |

* cited by examiner

*Primary Examiner*—David Nhu
(74) *Attorney, Agent, or Firm*—Saliwanchik, Lloyd & Saliwanchik

(57) ABSTRACT

Disclosed is a method for manufacturing an image sensor. The method includes forming a polysilicon layer on a semiconductor substrate having an active region, forming a sacrificial layer on the polysilicon layer, forming a photoresist pattern on the sacrificial layer, implanting conductive impurities onto the polysilicon layer using the photoresist pattern as an ion implantation mask, removing the photoresist pattern, and removing the sacrificial layer from the polysilicon layer, thereby removing photoresist residues remaining on the sacrificial layer.

14 Claims, 3 Drawing Sheets

METHOD FOR MANUFACTURING IMAGE SENSOR

CROSS-REFERENCE TO RELATED APPLICATION

The present application claims the benefit under 35 U.S.C. §119 of Korean Patent Application No. 10-2006-0114756, filed Nov. 20, 2006, which is hereby incorporated by reference in its entirety.

BACKGROUND

An image sensor creates an image signal by using electrons generated from a photodiode corresponding to an amount of light incident the photodiode through a micro-lens. The electrons generated from the photodiode are output to a data storage unit through a transistor.

In order to manufacture an image sensor, a polysilicon layer serving as a gate of a transistor is formed on a silicon substrate such as a wafer.

After the polysilicon layer is formed, a photoresist pattern having the opening for exposing a part, in which a photodiode is formed later, is formed on the polysilicon layer.

After the photoresist pattern is formed, conductive impurities are implanted into the silicon substrate through the polysilicon layer by using the photoresist pattern as an ion implantation mask, thereby manufacturing the photodiode generating electrons corresponding to an amount of light.

When the photodiode is formed, the conductive impurities are implanted even onto the photoresist pattern.

When the conductive impurities are implanted onto the photoresist pattern, hydrogen ions (H+) are removed from the surface of the photoresist pattern, thereby forming a crust having no hydrogen ions (H+).

The crust formed on the surface of the photoresist pattern is not readily removed through an ashing process.

BRIEF SUMMARY

Accordingly embodiments of the present invention provide a method for manufacturing an image sensor capable of effectively removing crust particles.

According to an embodiment, a method for manufacturing an image sensor includes forming a polysilicon layer on a semiconductor substrate having an active region, forming a sacrificial layer on the polysilicon layer, forming a photoresist pattern on the sacrificial layer, in which the photoresist pattern exposes the polysilicon layer in a photodiode area of the active region, implanting conductive impurities onto the polysilicon layer using the photoresist pattern as an ion implantation mask, removing the photoresist pattern, and removing the sacrificial layer from the polysilicon layer, thereby removing photoresist residues remaining on the sacrificial layer.

BRIEF DESCRIPTION OF THE DRAWINGS

FIG. 1 is a cross-sectional view showing a polysilicon layer formed on a silicon substrate according to an embodiment;

FIG. 2 is a cross-sectional view showing a sacrificial layer formed on a polysilicon layer shown in FIG. 1;

FIG. 3 is a cross-sectional view showing a photodiode formed by implanting conductive impurities onto a polysilicon layer shown in FIG. 2;

FIG. 4 is a cross-sectional view showing a photodiode in which a photoresist pattern shown in FIG. 3 is removed; and FIG. 5 is a view showing a photodiode in which a sacrificial layer is removed in order to remove crust shown in FIG. 4.

DETAILED DESCRIPTION

Hereinafter, a method for manufacturing an image sensor according to embodiments of the present invention will be described in detail with reference to accompanying drawings.

FIGS. 1 to 5 are sectional views showing a method for manufacturing an image sensor according to an embodiment.

Figure 1:
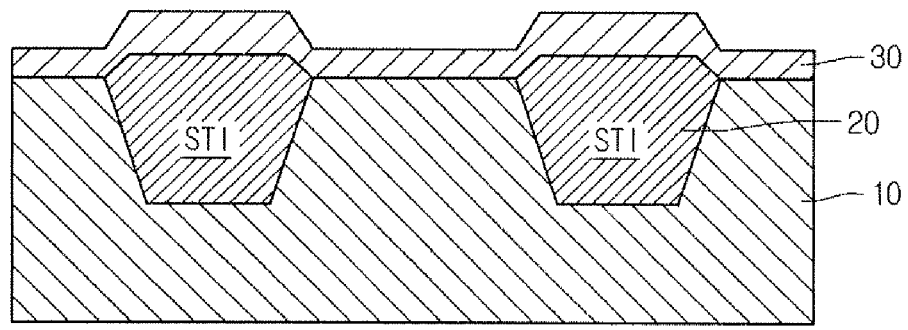
FIGS. 1-5 are cross-sectional views for explaining a method for manufacturing an image sensor according to an embodiment of the present invention.

Referring to FIG. 1, isolation patterns 20 can be formed on a silicon substrate 10, and an active region is defined between the isolation patterns 20.

After the isolation patterns 20 are formed, a polysilicon layer 30 can be formed on the semiconductor substrate 10. For example, the polysilicon layer 30 can be formed through a chemical vapor deposition (CVD) process. In addition, in one embodiment, the thickness of the polysilicon layer 30 is in the range of about 100 nm to about 300 nm.

Figure 2:
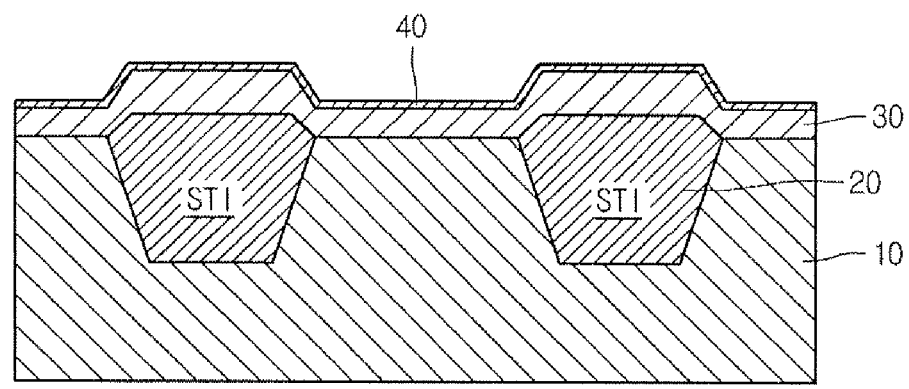

Referring to FIG. 2, after the polysilicon layer 30 is formed on the silicon substrate 10, a sacrificial layer 40 can be formed on the polysilicon layer 30. For example, the sacrificial layer 40 can be formed by thermal-oxidizing the polysilicon layer 30. In addition, the thickness of the sacrificial layer 40 can be in the range of about 1 nm to about 5 nm.

According to embodiments of the present invention, the sacrificial layer 40 is a polysilicon oxidation layer.

In order to form the sacrificial layer 40 on the polysilicon layer 30, the sacrificial layer 40 can be formed in a furnace through an oxidation process. In one embodiment, the sacrificial layer 40 is formed through an RTP (rapid thermal oxidation process).

Figure 3:
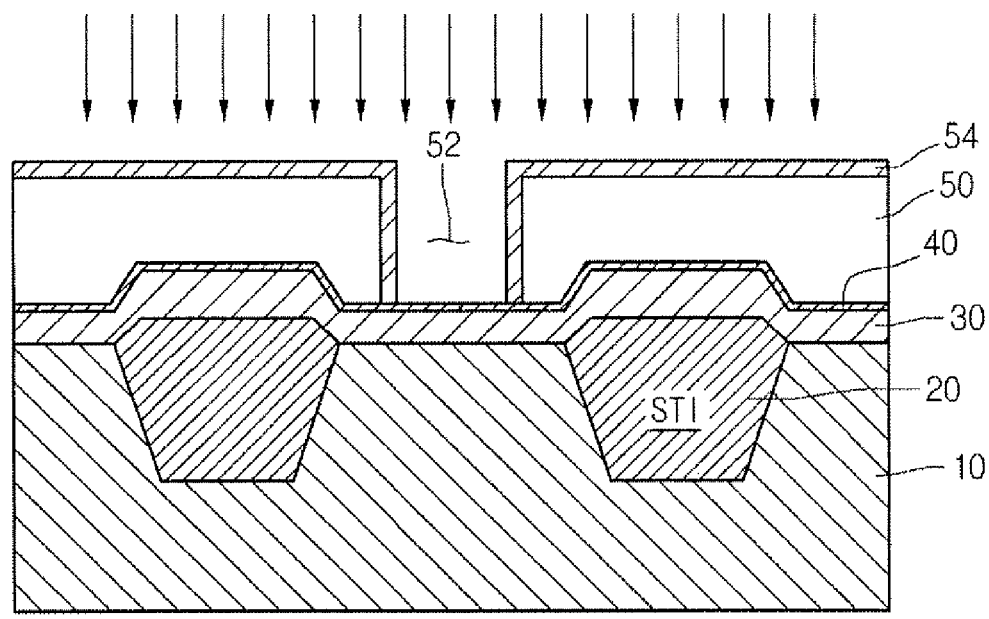

Referring to FIG. 3, after the sacrificial layer 40 is formed on the polysilicon layer 30, a photoresist film can be formed on the entire surface of the sacrificial layer 40. For example, the photoresist film can be formed through a spin coating scheme.

After the photoresist film is formed, the photoresist film is patterned through a photo process including an exposure and development process, thereby forming a photoresist pattern 50.

The photoresist pattern 50 includes an opening 52 to expose the sacrificial layer 40 on the polysilicon layer 30 formed between the isolation patterns 20.

After the photoresist pattern 50 is formed, conductive impurities can be implanted into the polysilicon layer 30 using the photoresist pattern 50 as an ion implantation mask.

The conductive impurities can be elements of group III or group V in a periodic table. For example, the conductive impurity implanted into the polysilicon layer 30 can be phosphorus (P). In addition, the number of ions implanted into the polysilicon layer 30 is in the range of $1 \times 10^{15}$ to $9.9 \times 10^{15}$ atoms/cm$^2$, and ion implantation energy is in the range of 10 KeV to 50 KeV.

The conductive impurities are implanted into the polysilicon layer 30 using the photoresist pattern 50 as an ion implantation mask, which lowers the resistance of the polysilicon layer 30 in the exposed region.

In detail, if conductive impurities, which are elements of group III or group V, are implanted into the polysilicon layer 30, electrons or holes are generated in the polysilicon layer 30 to lower the resistance of the polysilicon layer 30. Accordingly, the conductivity of the polysilicon layer 30 may increase.

Meanwhile, when conductive impurities are implanted into the polysilicon layer 30, the conductive impurities are also implanted into the surface of the photoresist pattern 50 used as an ion implantation mask. Accordingly, a crust layer 54 having no hydrogen ions is formed on the surface of the photoresist pattern 50.

Figure 4:
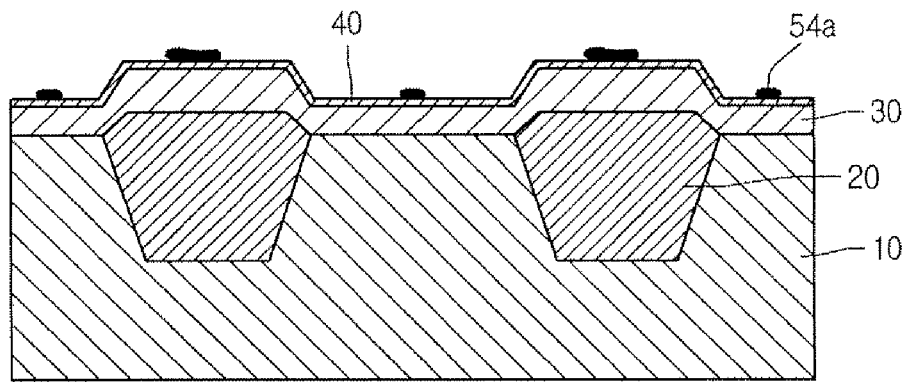

Referring to FIG. 4, the photoresist pattern 50 formed on the sacrificial layer 40 is removed from the sacrificial layer 40.

In order to remove the photoresist pattern 50, an SPM (sulfuric-peroxide-mixture) solution, which is a mixed solution of sulfuric acid and oxygenated water, can be used. In addition, a mixed solution obtained by mixing an SCI solution with hydrogen fluoride diluted by a mixed solution of sulfuric acid and water can be used.

In detail, "sulfuric acid ($H_2SO_4$):hydrogen peroxide ($H_2O_2$)" can be "6:1" in the SPM solution. In the hydrogen fluoride (HF), "hydrogen fluoride (HF):water ($H_2O$)" can be "1:100". In the SCI solution including $NH_4HOH$, $H_2O_2$, and $H_2O$, "$NH_4HOH$:$H_2O_2$:$H_2O$" can be "1:2:100".

Referring to FIG. 4, when the photoresist pattern 50 is removed from the top surface of the sacrificial layer 40, the crust layer 54 having no hydrogen (H) is popped, so that a great amount of crusts 54a, which are residues of the photoresist, may be created on the sacrificial layer 40.

Without the sacrificial layer 40 the crusts 54a would form particulates on the polysilicon layer 30 that inhibit the pattern of the polysilicon layer 30 from being precisely formed.

Accordingly, since the sacrificial layer 40 is formed on the polysilicon layer 30, the crusts 54a are created on the sacrificial layer 40.

Figure 5:
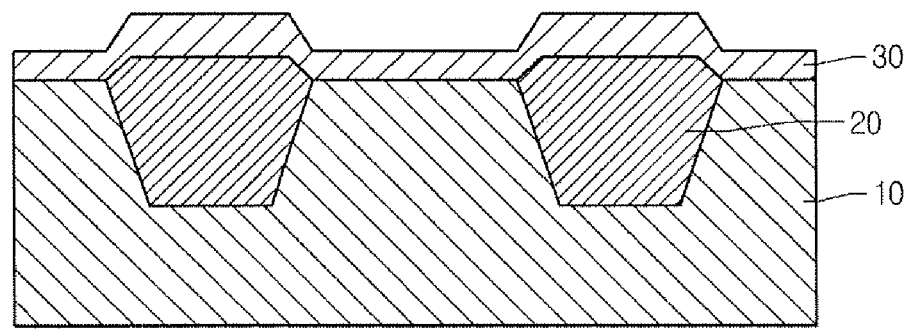

Referring to FIG. 5, the sacrificial layer 40 is removed. When removing the sacrificial layer 40, the crusts 54a remaining on the top surface of the sacrificial layer 40 are removed.

Accordingly, the polysilicon layer 30 having no crusts 54a remains on the silicon substrate 10.

Thereafter, the polysilicon layer 30, into which the conductive impurities are implanted is patterned, to form a polysilicon gate.

The sacrificial layer 40 can be used even when implanting impurities using a photoresist pattern as a mask in the subsequent processes.

Thereafter, a thin film transistor structure can be formed including the polysilicon gate, and an interlayer dielectric layer and an interconnection can be formed on the thin film transistor structure. Then, a color filter and a micro-lens are formed to complete the manufacturing of the image sensor.

According to an embodiment, the pattern failure of the polysilicon layer caused by crusts having no hydrogen that were created by ions implanted into the photoresist pattern in an ion implantation process for the polysilicon layer can be prevented or inhibited from occurring, thereby improving the quality of the image sensor.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, comprising:
    forming a polysilicon layer on a semiconductor substrate having an active region;
    forming a sacrificial layer on the polysilicon layer;
    forming a photoresist pattern on the sacrificial layer exposing a portion of the sacrificial layer on the active region;
    implanting conductive impurities into the polysilicon layer using the photoresist pattern as an ion implantation mask;
    removing the photoresist pattern; and
    removing the sacrificial layer from the polysilicon layer, thereby removing photoresist residues remaining on the sacrificial layer,
    wherein removing the photoresist pattern comprises using a Sulfuric-Peroxide-Mixture (SPM) solution, which is a mixed solution of sulfuric acid and oxygenated water, or using a mixed solution of a Standard Clean 1 (SCI) solution and hydrogen fluoride diluted by a mixed solution of sulfuric acid and water.

2. The method for manufacturing an image sensor according to claim 1, wherein, brining the sacrificial layer comprises oxidizing the polysilicon layer.

3. The method for manufacturing an image sensor according to claim 1, wherein forming the sacrificial layer comprises performing a thermal oxidation process.

4. The method for manufacturing an image sensor according to claim 1, wherein forming the sacrificial layer comprises depositing an oxide material on the polysilicon layer.

5. The method for manufacturing an image sensor according to claim 1, wherein the sacrificial layer has a thickness in a range of 1 nm to 5 nm.

6. The method for manufacturing an image sensor according to claim 1, wherein removing the sacrificial layer comprises using etchant including hydrogen fluoride (HF).

7. The method for manufacturing an image sensor according to claim 1, wherein implanting conductive impurities comprises implanting phosphorus (P) using a dose in a range of $1 \times 10^{15}$ atoms/cm$^2$ to $9.9 \times 10^{15}$ atoms/cm$^2$ and an ion implantation energy in a range of 10 KeV to 50 KeV.

8. A method for manufacturing an image sensor, comprising:
    forming a polysilicon layer on a semiconductor substrate having an active region;
    forming a sacrificial layer on the polysilicon layer;
    forming a photoresist pattern on the sacrificial layer exposing a portion of the sacrificial layer on the active region;
    implanting conductive impurities into the polysilicon layer using the photoresist pattern as an ion implantation mask;
    removing the photoresist pattern; and removing the sacrificial layer from the polysilicon layer, thereby removing photoresist residues remaining on the sacrificial layer, wherein implanting conductive impurities comprises implanting phosphorus (P) using a dose in a range of $1\times10^{15}$ atoms/cm$^2$ to $9.9\times10^{15}$ atoms/cm$^2$ and an ion implantation energy in a range of 10 KeV to 50 KeV.

9. The method for manufacturing an image sensor according to claim 8, wherein, forming the sacrificial layer comprises oxidizing the polysilicon layer.

10. The method for manufacturing an image sensor according to claim 8, wherein forming the sacrificial layer comprises performing a thermal oxidation process.

11. The method for manufacturing an image sensor according to claim 8, wherein forming the sacrificial layer comprises depositing an oxide material on the polysilicon layer.

12. The method for manufacturing an image sensor according to claim 8, wherein the sacrificial layer has a thickness in a range of 1 nm to 5 nm.

13. The method for manufacturing an image sensor according to claim 8, wherein removing the sacrificial layer comprises using etchant including hydrogen fluoride (HF).

14. The method for manufacturing an image sensor according to claim 8, wherein removing the photoresist pattern comprises using a Sulfuric-Peroxide-Mixture (SPM) solution, which is a mixed solution of sulfuric acid and oxygenated water, or using a mixed solution of a Standard Clean 1 (SCI) solution and hydrogen fluoride diluted by a mixed solution of sulfuric acid and water.

* * * * *